(12) United States Patent
Egashira

(10) Patent No.: US 11,067,908 B2
(45) Date of Patent: Jul. 20, 2021

(54) MEASUREMENT APPARATUS, EXPOSURE APPARATUS, AND METHOD OF MANUFACTURING ARTICLE

(71) Applicant: CANON KABUSHIKI KAISHA, Tokyo (JP)

(72) Inventor: Shinichi Egashira, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/787,174

(22) Filed: Feb. 11, 2020

(65) Prior Publication Data
US 2020/0264524 A1    Aug. 20, 2020

(30) Foreign Application Priority Data
Feb. 14, 2019    (JP) .............................. JP2019-024696

(51) Int. Cl.
*G03F 9/00* (2006.01)
*G01B 11/00* (2006.01)
(Continued)

(52) U.S. Cl.
CPC .......... *G03F 9/7084* (2013.01); *G01B 11/002* (2013.01); *G01B 11/0608* (2013.01);
(Continued)

(58) Field of Classification Search
CPC .... G03F 9/7003; G03F 9/7023; G03F 9/7026; G03F 9/7034; G03F 9/7046; G03F 9/7049; G03F 9/7073; G03F 9/7084; G03F 9/7088; G03F 7/70641; G01B 11/002; G01B 11/06; G01B 11/068; G01B 11/14; G01N 21/41
See application file for complete search history.

(56) References Cited

U.S. PATENT DOCUMENTS

| 5,191,200 A * | 3/1993 | van der Werf ....... G02B 21/241 250/201.4 |
| 9,400,436 B2 * | 7/2016 | Maeda .................. G03F 9/7084 |

(Continued)

FOREIGN PATENT DOCUMENTS

| EP | 2722714 A2 | 4/2014 |
| JP | 6025346 B2 | 11/2016 |

OTHER PUBLICATIONS

Extended European Search Report issued in European Appln. No. 20154931.8 dated Jul. 20, 2020.

*Primary Examiner* — Gordon J Stock, Jr.
(74) *Attorney, Agent, or Firm* — Rossi, Kimms & McDowell LLP

(57) ABSTRACT

A measurement apparatus that measures a position of a mark formed between first and surfaces of a substrate is provided. The apparatus includes a stage that holds and moves the substrate, a first detector that detects an image of the mark, a second detector that detects a height position of the first surface, and a processor that determines, based on the detected height position, an offset amount used to set the focus of the first detector to the mark. The processor includes a first mode in which the offset amount is determined based on a first distance set as a distance from the first surface to the mark, and a second mode in which the offset amount is determined based on a second distance set as a distance from the second surface to the mark.

13 Claims, 7 Drawing Sheets

(51) Int. Cl.
*G01B 11/06* (2006.01)
*G01B 11/14* (2006.01)
*G01N 21/41* (2006.01)
*G03F 7/20* (2006.01)

(52) U.S. Cl.
CPC ............ *G01B 11/14* (2013.01); *G01N 21/41* (2013.01); *G03F 7/70641* (2013.01); *G03F 9/7026* (2013.01); *G03F 9/7088* (2013.01)

(56) References Cited

U.S. PATENT DOCUMENTS

| | | |
|---|---|---|
| 9,523,927 B2 | 12/2016 | Maeda |
| 9,939,741 B2* | 4/2018 | Maeda .................. G03F 9/7026 |
| 10,788,765 B2* | 9/2020 | Witte .................. G01B 11/2441 |
| 2009/0237635 A1 | 9/2009 | Best |
| 2010/0277710 A1* | 11/2010 | Egashira ............... G03F 9/7011 |
| | | 355/77 |
| 2012/0307226 A1* | 12/2012 | Maeda .................. G03F 9/7069 |
| | | 355/72 |
| 2013/0321811 A1* | 12/2013 | Maeda .................. G01B 11/14 |
| | | 356/400 |
| 2017/0082424 A1* | 3/2017 | Li ....................... G02B 27/0025 |
| 2021/0003930 A1* | 1/2021 | Yamaguchi ........... G03F 9/7088 |

* cited by examiner

MEASUREMENT APPARATUS, EXPOSURE APPARATUS, AND METHOD OF MANUFACTURING ARTICLE

BACKGROUND OF THE INVENTION

Field of the Invention

The present invention relates to a measurement apparatus, an exposure apparatus, and a method of manufacturing an article.

Description of the Related Art

In order to detect with high accuracy the position of a mark formed on a substrate, measurement needs to be performed in a focus position where the contrast is highest when an image of the mark is to be observed. However, in a measurement operation (image autofocus operation) that searches for a focus position where the contrast of a mark is highest, the search for the highest contrast position needs to be performed after performing mark observation and contrast calculation on a plurality of focus positions. Hence, the measurement operation takes time. Thus, there is a technique in which the speed of an image autofocus measurement operation is increased by using a substrate surface detection system capable of high-speed measurement to measure a focus position, which is to be a search starting point, in order to limit the search range of the image autofocus operation.

For example, Japanese Patent No. 6025346 discloses that the starting position of an image autofocus operation is determined based on an amount of offset from a surface position on a substrate and a preset substrate thickness amount and a preset refractive index of the substrate.

In a multilayered substrate, a mark is arranged in a middle layer between the upper surface and the lower surface of a substrate, and the position of this mark needs to be measured. Normally, a design value is registered as the distance between the surface of the substrate and the mark. Although it is possible to use this registered design value for measurement, the actual distance will vary among a plurality of substrates. If there is a large variation, the starting point of an image autofocus operation which is determined based on the preset substrate thickness amount may become inappropriate. In such a case, the measurement time will increase due to the expansion of the search range in the image autofocus operation, and lead to throughput degradation.

SUMMARY OF THE INVENTION

The present invention provides a measurement apparatus that is advantageous in both the accuracy and the throughput of substrate mark position measurement.

The present invention in its one aspect provides a measurement apparatus that measures a position of a mark formed between a first surface and a second surface on a side opposite to the first surface of a substrate. The apparatus includes a stage configured to hold and move the substrate, a first detector configured to detect an image of the mark, a second detector configured to detect a height position of the first surface, and a processor configured to determine, based on the height position of the first surface detected by the second detector, an offset amount used to set the focus of the first detector to the mark. The processor includes a first mode in which the offset amount is determined based on a first distance set as a distance from the first surface to the mark, and a second mode in which the offset amount is determined based on a second distance set as a distance from the second surface to the mark.

Further features of the present invention will become apparent from the following description of exemplary embodiments (with reference to the attached drawings).

DESCRIPTION OF THE EMBODIMENTS

Figure 1:
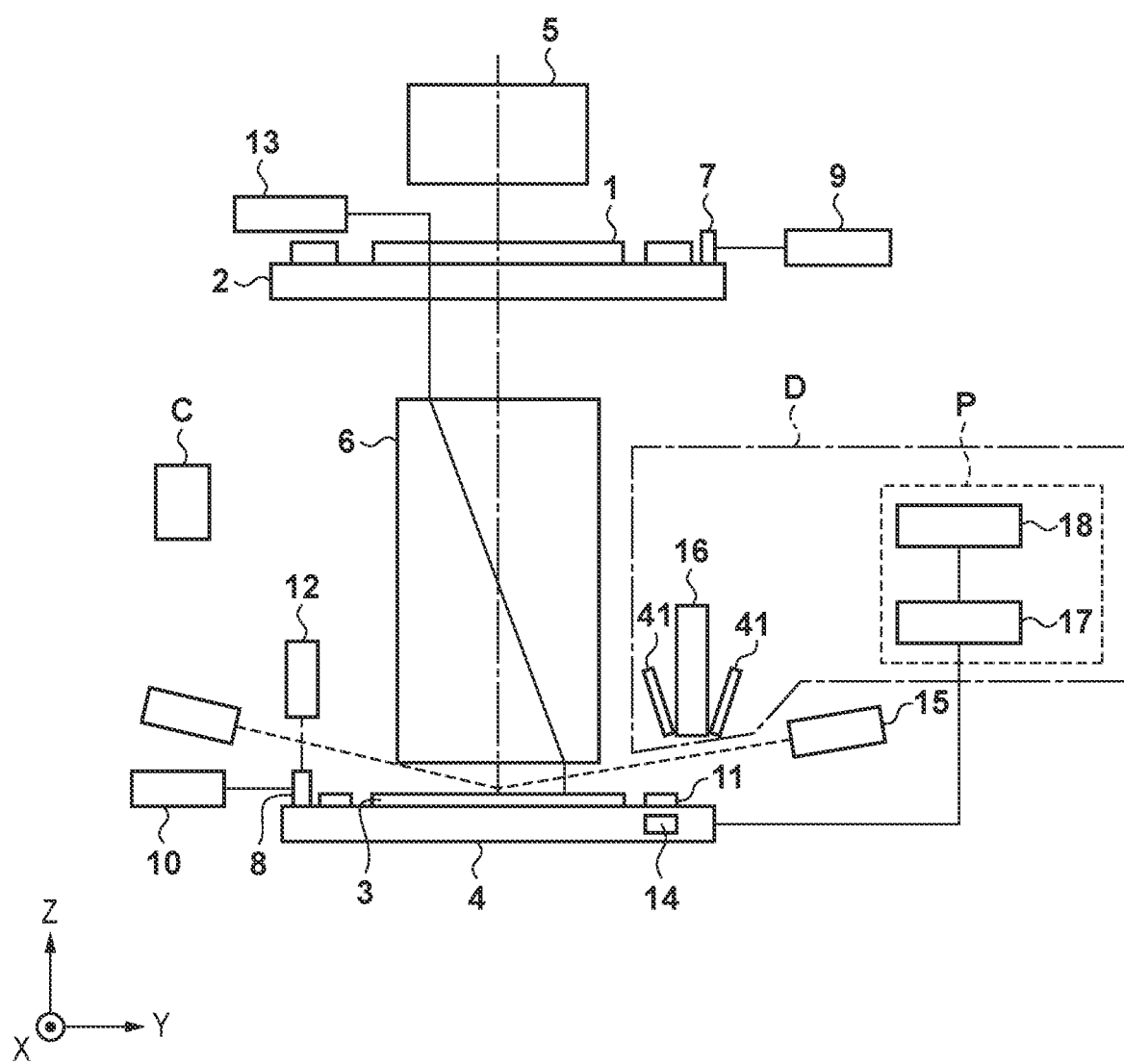
FIG. 1 is a view showing the arrangement of an exposure apparatus according to this embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

A measurement apparatus of this present invention can be employed in, for example, an exposure apparatus used in a lithography process of a manufacturing process of an article such as a semiconductor device, liquid crystal display device, or the like, and can measure a surface position of a substrate. FIG. 1 is a view showing the arrangement of an exposure apparatus to which the measurement apparatus of this present invention has been applied. In this specification and the accompanying drawings, directions are indicated based on an X-Y-Z coordinate system in which a direction parallel to the upper surface of a wafer 3 is set as an X-Y plane. In this case, an optical axis direction of a projection optical system 6 is a Z direction perpendicular to the X-Y plane. Directions parallel to an X-axis, a Y-axis, and a Z-axis are referred to as an X direction, a Y direction, and the Z direction, respectively. Reference symbols θX, θY, and θZ represent a rotation about the X-axis, a rotation about the Y-axis, a rotation about the Z-axis, respectively. Control or driving related to the Z-axis, the Y-axis, and the Z-axis represent control or driving performed in relation to a direction parallel to the X-axis, a direction parallel to the Y-axis, and a direction parallel to the Z-axis, respectively. Also, control or driving related to the θX-axis, the θY-axis, and the θZ-axis represent control or driving performed in relation to a rotation about an axis parallel to the X-axis, a rotation about an axis parallel to the Y-axis, and a rotation about an axis parallel to the Z-axis, respectively. In addition, a position is information that can be specified based on the coordinates of the X-axis, the Y-axis, and the Z-axis, and an orientation is information that can be specified based on the values of the θX-axis, the θY-axis, and the θZ-axis. Positioning represents controlling the position and/or the orientation. Alignment can include controlling a position and/or orientation of at least one of a substrate and an original.

The exposure apparatus shown in FIG. 1 can be a scanning exposure apparatus (scanner) that projects and exposes a pattern formed on a reticle 1 onto the wafer 3 while moving the reticle 1 as an original (mask) and the wafer 3 as a substrate in the scanning direction. Alternatively, the exposure apparatus may be an exposure apparatus (stepper) that fixes the reticle and projects and exposes the pattern of the reticle 1 on the wafer 3.

A reticle stage 2 can hold and move the reticle 1, and a wafer stage 4 can hold and move the wafer 3. An illumination optical system 5 illuminates the reticle 1 with exposure light. The projection optical system 6 projects a pattern image of the reticle 1, which has been illuminated by the exposure light, onto the wafer 3 held by the wafer stage 4. A controller C comprehensively controls the operation of the overall exposure apparatus.

A mirror 7 is arranged on the reticle stage 2, and an X-Y direction laser interferometer 9 is arranged in a position which faces the mirror 7. The position and the rotational angle in the two-dimensional direction of the reticle 1 are measured by the laser interferometer 9 in real time, and the measurement results are output to the controller C. The controller C controls a driver of the reticle stage 2 based on the measurement result from the laser interferometer 9 to position the reticle 1 which is supported by the reticle stage 2.

The wafer stage 4 includes a Z stage which holds the wafer 3 via a wafer chuck, an X-Y stage which supports the Z stage, and a base which supports the X-Y stage. A driver (not shown) such as a linear motor or the like drives the wafer stage 4. The controller C controls the driver of the wafer stage 4. A mirror 8 is arranged on the wafer stage 4. An X-Y direction laser interferometer 10 and a Z-direction laser interferometer 12 are arranged in positions that face the mirror 8. A position in the X-Y direction and the rotation θZ of the wafer stage 4 are measured by the laser interferometer 10 in real time, and the measurement results are output to the controller C. A position in the Z direction, the rotation θX, and the rotation θY of the wafer stage 4 are measured by the laser interferometer 12 in real time, and the measurement results are output to the controller C. The controller C positions the wafer 3 supported by the wafer stage 4 by controlling the driver of the wafer stage 4 based on the measurement results from the laser interferometers 10 and 12 to drive the X-Y stage and the Z stage and adjust the position of the wafer 3 in the X, Y, and Z directions.

A reticle alignment detector 13 adjusts the relative positional relationship between the reticle 1 and the wafer 3 by detecting a reference mark (not shown) on a reference plate 11 on the wafer stage 4 through the projection optical system 6 and a reference mark (not shown) on the reticle 1. A focus detector 15 includes a projection system that projects detection light to the surface of the wafer 3 and a light reception system that receives the reflected light from the wafer 3, and the detection result of the focus detector 15 is output to the controller C. The controller C drives the Z stage based on the detection result from the focus detector 15, and makes adjustments so that the tilt angle and the position (the height position, that is, the focus position) in the Z direction of the wafer 3 held on the Z stage will fall within permitted ranges.

The exposure apparatus includes a measurement apparatus D that measures the position of a mark formed between a first surface (upper surface) of the substrate and a second surface (lower surface) on the opposite side of the first surface. The measurement apparatus D includes a wafer alignment detector 16 which is a first detector for detecting the image of a mark, an AF detector 41 (autofocus detector) which is a second detector for detecting the height position of the first surface of the substrate, and a processor P. The processor P can include a memory 17 and an input device 18.

The wafer alignment detector 16 includes a projection system that projects detection light to a mark formed on the wafer 3 and a light reception system that receives the reflected light from the mark. The detection result of the wafer alignment detector 16 is output to the controller C. The controller C can adjust the position of the wafer 3 in the X-Y direction by driving the wafer stage 4 in the X-Y direction based on the detection result of the wafer alignment detector 16.

The AF detector 41 detects a surface position of the wafer 3 to perform support to obtain the best focus position for the wafer alignment detector 16. The AF detector 41 includes, in the same manner as the focus detector 15, a projection system that projects detection light to the surface of the wafer 3 and a light reception system that receives the reflected light from the wafer 3. While the focus detector 15 is used for obtaining the best focus position for the projection optical system 6, the AF detector 41 is used for obtaining the best focus position for the wafer alignment detector 16.

Figure 2:
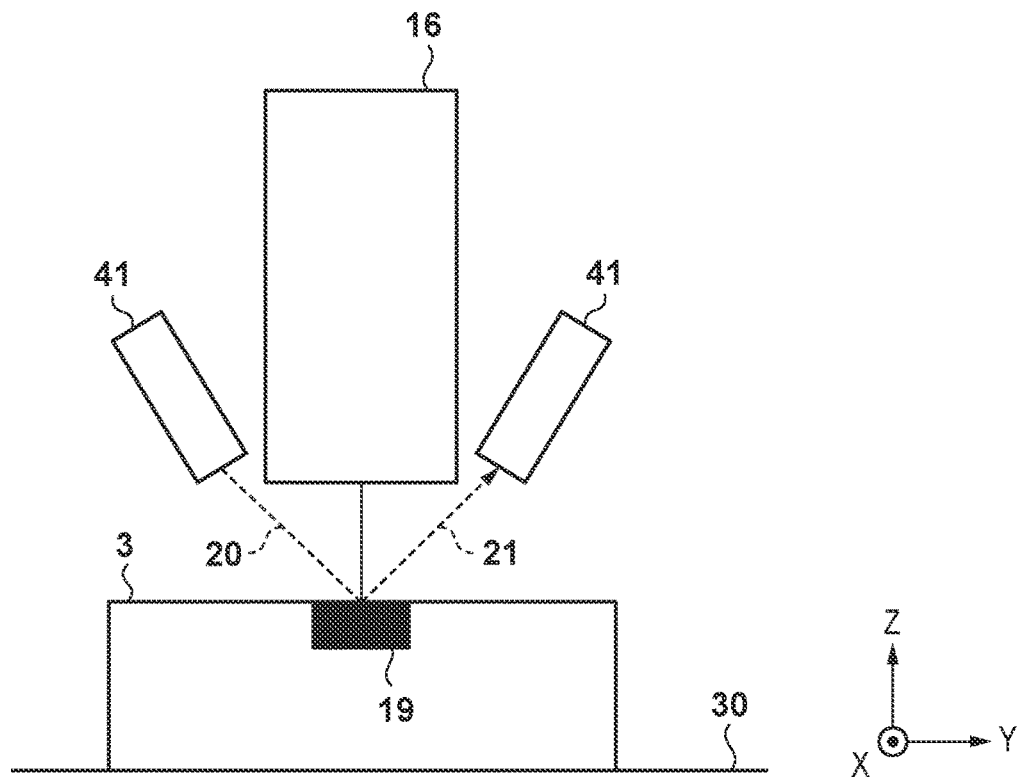
FIG. 2 is a view for explaining an operation of an AF detector.

The AF detector 41 uses the projection system to obliquely project AF light to the wafer 3 and uses the AF detection sensor (not shown) of the light reception system to receive the reflected light from the wafer 3. FIG. 2 shows a state in which the AF detector 41 is performing focus measurement on the wafer 3 on which a mark 19 has been provided on the surface. When the wafer 3 moves in the focus direction (Z direction), the AF light reception position of the AF detection sensor shifts in accordance with the movement. Hence, the AF detector 41 can measure the height position of the wafer 3 based on the AF light reception position of the AF detection sensor. See Japanese Patent No. 6025346 for a more specific example of the arrangement of the wafer alignment detector 16 and the AF detector 41.

The focus measurement operation by the AF detector 41 is performed not to measure the best focus position for mark detection by the wafer alignment detector 16, but to detect the surface position (the height position of the surface of the uppermost layer) of the wafer 3. The focus measurement operation by the AF detector 41 is measurement performed to make the mark image focus state of the wafer alignment detector 16 fall within the permitted range. Since the AF detector 41 detects the AF light reflected by the surface of the wafer 3, the AF detector 41 cannot directly detect the focus position of the mark arranged in the middle layer or on the lower surface of the wafer 3.

Figure 3:
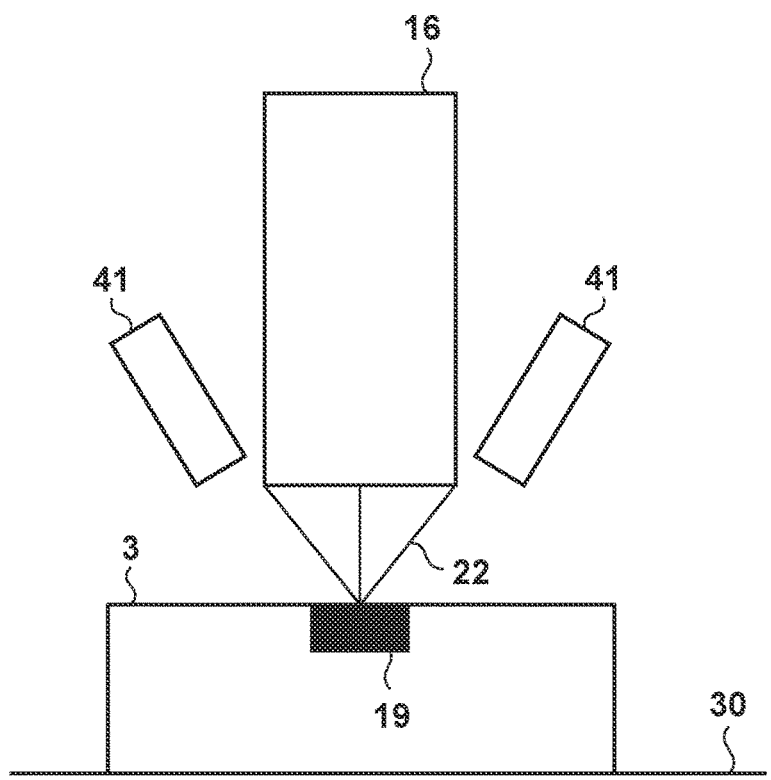
FIG. 3 is a view for explaining an image autofocus measurement operation by a wafer alignment detector.

An "image autofocus measurement" operation of obtaining the best focus position for the wafer alignment detector 16 to detect the mark 19 in a case in which the mark 19 is arranged on the upper surface of the wafer 3 will be described with reference to FIG. 3. In the image autofocus measurement operation, the AF detector 41 first detects the surface position of the wafer 3. The obtained surface position can be used to schematically match the focus position of the wafer alignment detector 16 with the mark 19. Subsequently, the mark 19 is irradiated with measurement light 22 from the wafer alignment detector 16.

Figure 4:
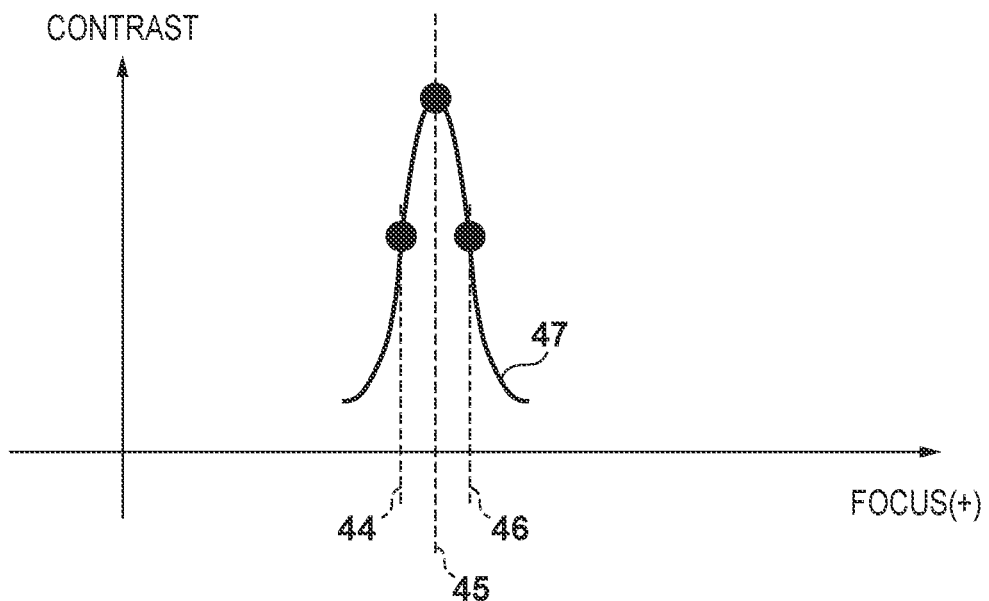
FIG. 4 is a graph for explaining best focus position obtainment processing.

Although the focus of the AF detector 41 is generally set to the mark 19 arranged on the surface of the wafer 3, a focus position at which the contrast of the image of the mark 19 becomes highest needs to be obtained for the wafer alignment detector 16 to perform alignment with high accuracy. Hence, the wafer alignment detector 16 obtains a contrast curve 47 as shown in FIG. 4 by calculating the contrast of the image of the mark 19 at each focus position while moving the wafer stage 4 in the Z direction. The contrast curve 47 shows the relationship between each focus position and the contrast. The wafer alignment detector 16 obtains, as the best focus position, a focus position at which the contrast is at the peak level in the contrast curve 47. To calculate the maximum contrast value, it is possible to use a method using quadratic polynomial fitting, barycenter calculation, or the like on the obtained contrast curve. Note that although only three focus positions 44, 45, and 46 of the image autofocus measurement are shown for the sake of descriptive convenience, the measurement points may be increased to 10 points or 20 points. Note that it may be arranged so that this autofocus control will be performed by the controller C or be performed by the processor P. Assume that it is arranged so that the autofocus control is performed by the processor P in this case.

Figure 5:
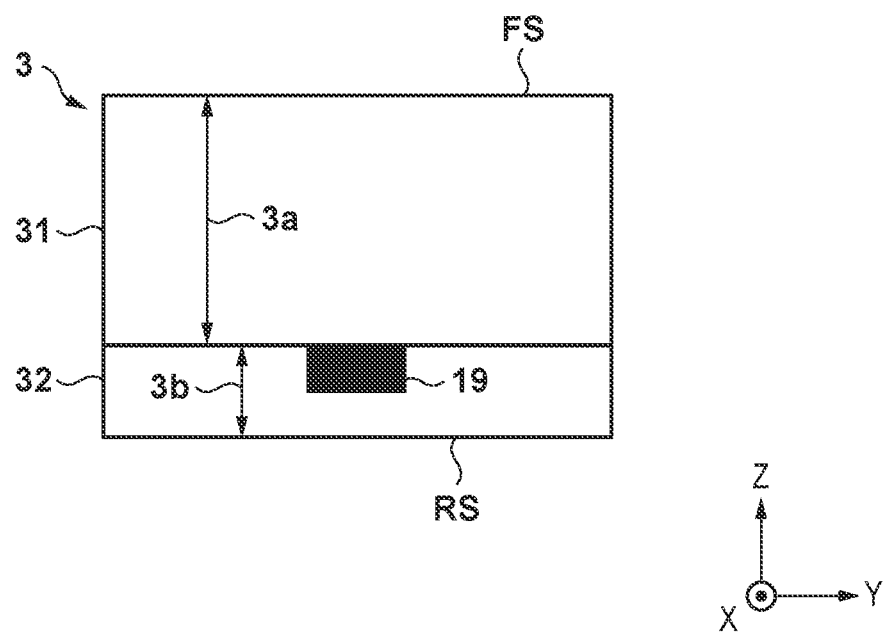
FIG. 5 is a view showing an example of a substrate on which a mark is formed between an upper surface and a lower surface.
Figure 6:
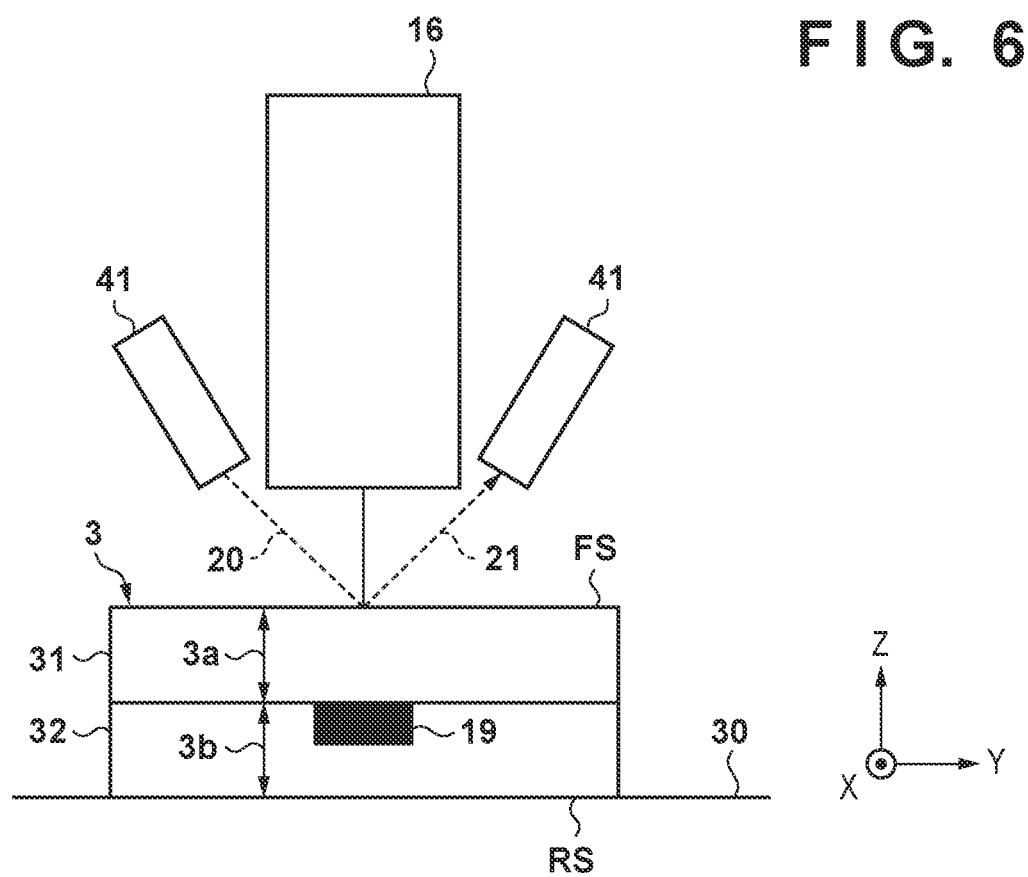
FIG. 6 is a view for explaining an operation by the AF detector which is performed on the substrate on which the mark is formed between the upper surface and the lower surface.
Figure 7:
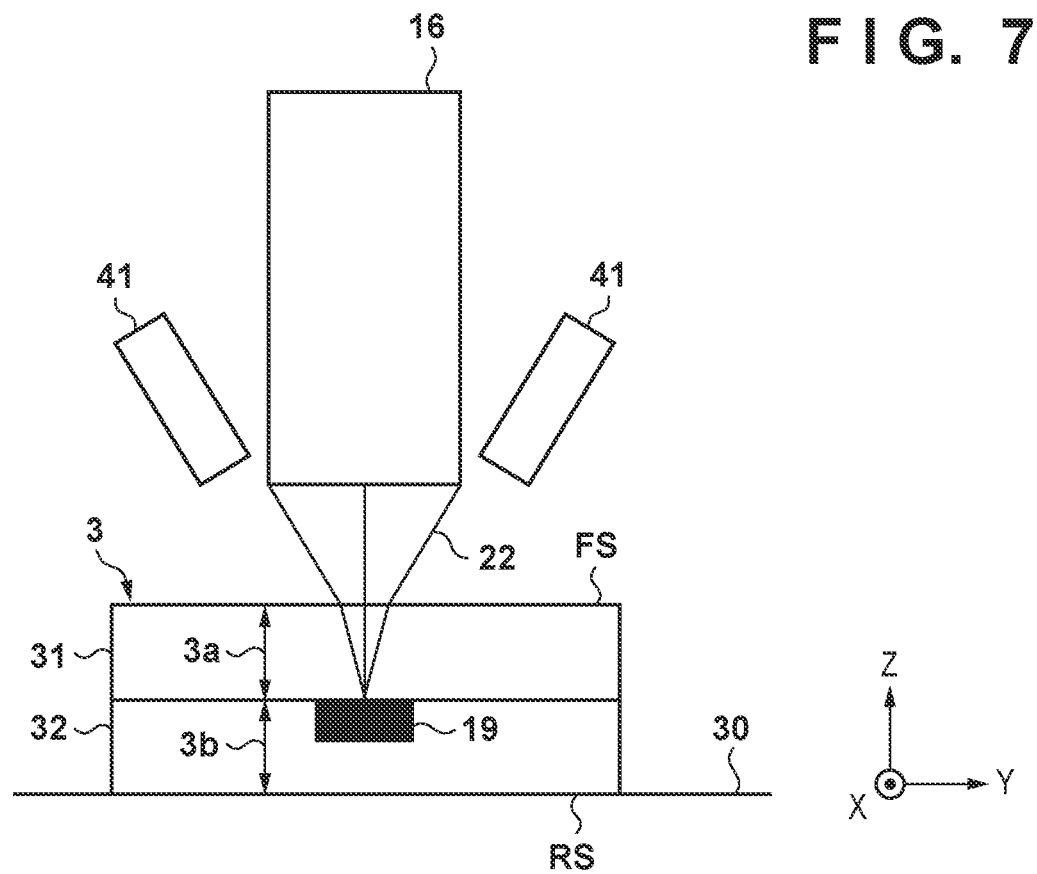
FIG. 7 is a view for explaining an offset driving operation of the wafer alignment detector.

The image autofocus measurement operation of a case in which the mark 19 is arranged between the upper surface (first surface) and the lower surface (second surface) of the wafer 3 will be described with reference to FIGS. 5, 6, and 7. In FIG. 5, the wafer 3 includes an upper layer 31 and a lower layer 32, and the mark 19 is covered by the upper layer 31. For example, the lower layer 32 can be made of a glass support substrate, and the upper layer 31 can be made of an Si layer. Reference numeral 3a represents a distance (that is, the thickness of the upper layer 31) from an upper surface FS of the wafer 3 to the mark 19, and reference numeral 3b represents a distance (that is, the thickness of the lower layer 32) from the mark 19 to a lower surface RS of the wafer 3.

The procedure of the image autofocus operation for measuring the position of the mark 19 is, for example, as follows. First, as shown in FIG. 6, the AF detector 41 detects the height position of the upper surface of the wafer 3. Next, to obtain the best focus position of the mark 19, the starting point of the image autofocus measurement operation is determined by using the distance 3a and the refractive index of the material of the upper layer 31 (the layer extending from the upper surface FS to the mark 19). The starting point determination method will be described in detail hereinafter.

The processor P determines, from the height position of the upper surface FS of the wafer 3 detected by the AF detector 41, the offset amount for adjusting the focus of the wafer alignment detector 16 on the mark 19. For example, the distance 3a (the thickness of the upper layer 31) from the upper surface FS to the mark 19 is input by a user via the input device 18, and this distance 3a is set as the first distance. In addition, the refractive index of the upper layer 31 can be input via the input device 18. These sets of input data are stored in the memory 17. The processor P determines, based on the distance 3a and the refractive index of the upper layer 31, the offset amount for adjusting the focus of wafer alignment detector 16 on the mark 19, and instructs the wafer stage 4 to be driven by the determined offset amount. An offset amount $OS_{top}$ in this case is expressed as follows.

$$OS_{top} = \text{distance } 3a/\text{refractive index of upper layer 31} \quad (1)$$

For example, in a case in which the upper layer 31 is a Si layer having a thickness of 200 μm, 200 μm/3.5 (the refractive index of the Si layer)≈57 μm. The focus of the wafer alignment detector 16 can be set to the mark 19 as shown in FIG. 7 by driving the wafer stage by this offset amount $OS_{top}$. Note that infrared light or the like that can be transmitted through Si is used as the measurement light of the wafer alignment detector 16. The processor P determines the offset amount by obtaining a value by dividing the distance 3a from the surface of the wafer 3 to the mark by the refractive index of the upper layer 31 in this manner. Subsequently, after the stage is moved to a height position offset by this offset amount, the focus control process for adjusting the height of the stage to set the focus of the wafer alignment detector 16 to the mark is started. As a result, rapid measurement can be performed. After the focus control process, the processor P obtains the position of the mark based on the image of the mark detected by the wafer alignment detector 16.

However, in the case of a bonded substrate as shown in FIG. 5, the measured value of the distance 3a from the upper surface FS of the wafer 3 to the mark 19 may vary among a plurality of substrates due to the influence from the process. As a result, the height position offset by the offset amount $OS_{top}$ in the manner described above becomes unsuitable as the starting position of the focus control operation, and the focus position search may require more time. In this case, depending on the process, the measured value of the distance 3b from the lower surface RS to the mark 19 may vary less among the plurality of substrates. For example, the variation in the measured values of the distance 3b may be less than the variation in the measured values of the distance 3a in a case in which 3a>3b or in a case in which lower layer 32 has a simple support substrate structure. In such a case, it is possible to reduce the influence of the variation and determine the starting position of the image autofocus measurement operation by calculating an offset amount by using the second distance set as the distance 3b from the lower surface RS to the mark 19. Letting $OS_{bottom}$ be this amount, the offset amount $OS_{bottom}$ is expressed as follows.

$$OS_{bottom} = (\text{total thickness of wafer} - \text{distance } 3b)/\text{refractive index of lower layer 32} \quad (2)$$

Note that the total thickness of the wafer can be calculated from the difference between the height position of the upper surface FS and the height position of the lower surface RS (=a wafer support surface 30) of the wafer 3. The height position of the upper surface of the wafer 3 can be detected by the AF detector 41. The height position of the lower surface RS can be obtained by using the AF detector 41 to measure the wafer support surface 30 in advance in a state without a wafer. Alternatively, the AF detector 41 can detect the height position of the surface of a wafer whose thickness is already known, and estimate the height position of the upper surface FS from the detection result.

As described above, in this embodiment, the processor P includes a first mode and a second mode in which the offset amount is determined differently from the first mode. In the first mode, an offset amount is determined based on the first distance set as a distance from the upper surface of the wafer to the mark. In the second mode, an offset amount is determined based on the second distance set as a distance from the lower surface of the wafer to the mark.

In the first mode, in accordance with equation (1) described above, a value obtained by dividing the first distance by a refractive index of the layer extending from the upper surface to the mark is determined to be the offset amount. In the second mode, in accordance with equation (2), a value obtained by dividing a value, which is obtained by subtracting the second distance from the total thickness (that is the distance between the upper surface and the lower surface of the wafer), by a refractive index of the layer extending from the upper surface to the mark is determined to be the offset amount.

For example, the distance (the thickness of the upper layer 31) from the upper surface FS to the mark 19 is input by the user via the input device 18, and this distance is set as the first distance. Also, the refractive index of the upper layer 31 can be input via the input device 18. In a similar manner, the distance (the thickness of the lower layer 32) from the mark 19 to the lower surface RS is input by the user via the input device 18, and this distance is set as the second distance. Also, the refractive index of the lower layer 32 can be input via the input device 18. These sets of input data are stored in the memory 17. Hence, by selecting and using, among the distance 3*a* and the distance 3*b*, the value of the distance with less variation among the plurality of wafers, it becomes possible to calculate the starting point of the image autofocus operation with reduced influence of the variation. As a result, it becomes possible to increase the speed of the measurement operation (that is, improve throughput) while maintaining the accuracy of the measurement of the position of the mark.

In this embodiment, whether the distance 3*a* or the distance 3*b* is to be used, that is, whether the first mode or the second mode is to be used can be selected in accordance with the set parameters. As a result, the processing operation can be performed by switching to the suitable processing (mode) in accordance with the process. Note that each parameter may be input based on the process design information or set, to the apparatus via the network, based on a value measured by an external thickness measurement apparatus.

Second Embodiment

For example, a variation in measured values of a distance 3*a* and a variation in the measured values of a distance 3*b* can be obtained among a plurality of substrates, and a mode corresponding to the distance with less variation can be automatically selected among the first mode and the second mode.

In this embodiment, an image autofocus operation is performed on a plurality of wafers based on distance information and wafer refractive index information input to the apparatus in advance. Each measured value is obtained based on the height position of the upper surface of a wafer detected by an AF detector 41 and a result of a focus control process by a wafer alignment detector 16. That is, the actual values of the distance 3*a* and the distance 3*b* of each wafer are calculated from the height position of the surface of the wafer and the result of the image autofocus operation.

Figure 8:
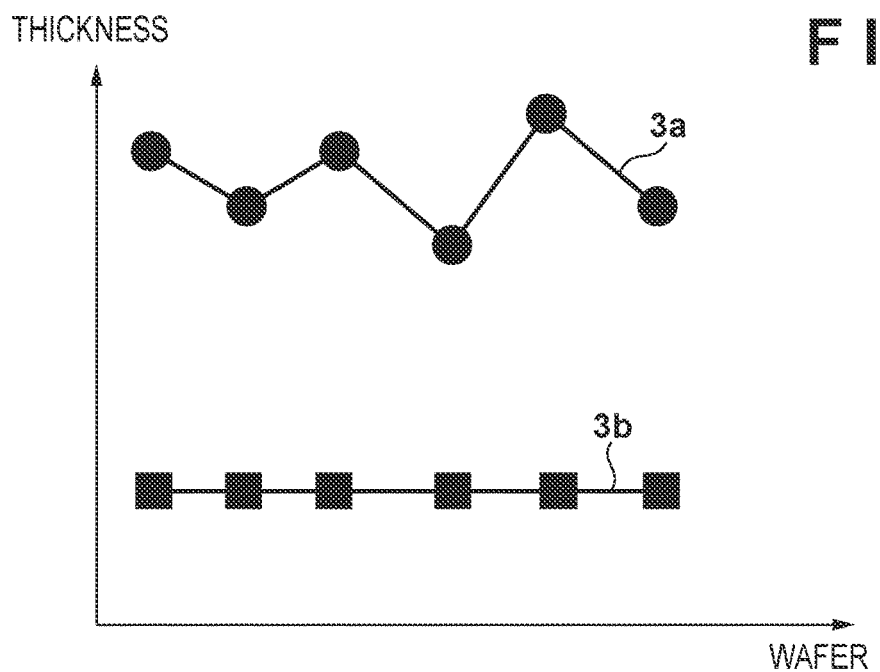
FIG. 8 is a graph showing an example of a result obtained by plotting measured values of layer thicknesses of respective wafers.

FIG. 8 is a graph showing an example of a result obtained by plotting the measured values of the distance 3*a* and the distance 3*b* of each wafer. The variation amount between the wafers for each distance is calculated from this result. In this case, for example, the first mode will be selected if the variation of the measured values of the distance 3*a* is less than the variation of the measured values of the distance 3*b*. Otherwise, the second mode will be selected. As a result, the starting position of the image autofocus operation is determined with high accuracy. Note that although a standard deviation, a dispersion value, or the like can be used as the variation amount between the wafers for each distance, the variation amount suffices to be an index representing the change ratio and is not limited to these examples.

In addition, the measured value can be fed back to the distance information set in advance. For example, each time a first measured value which is the measured value of the distance 3*a* and a second measured value which is the measured value of the distance 3*b* are obtained, a processor P may update the first distance and the second distance stored in a memory 17 by the first measured value and the second measured value. As a result, it is possible to maintain accurate distance information based on an actual measurement.

Third Embodiment

Figure 9:
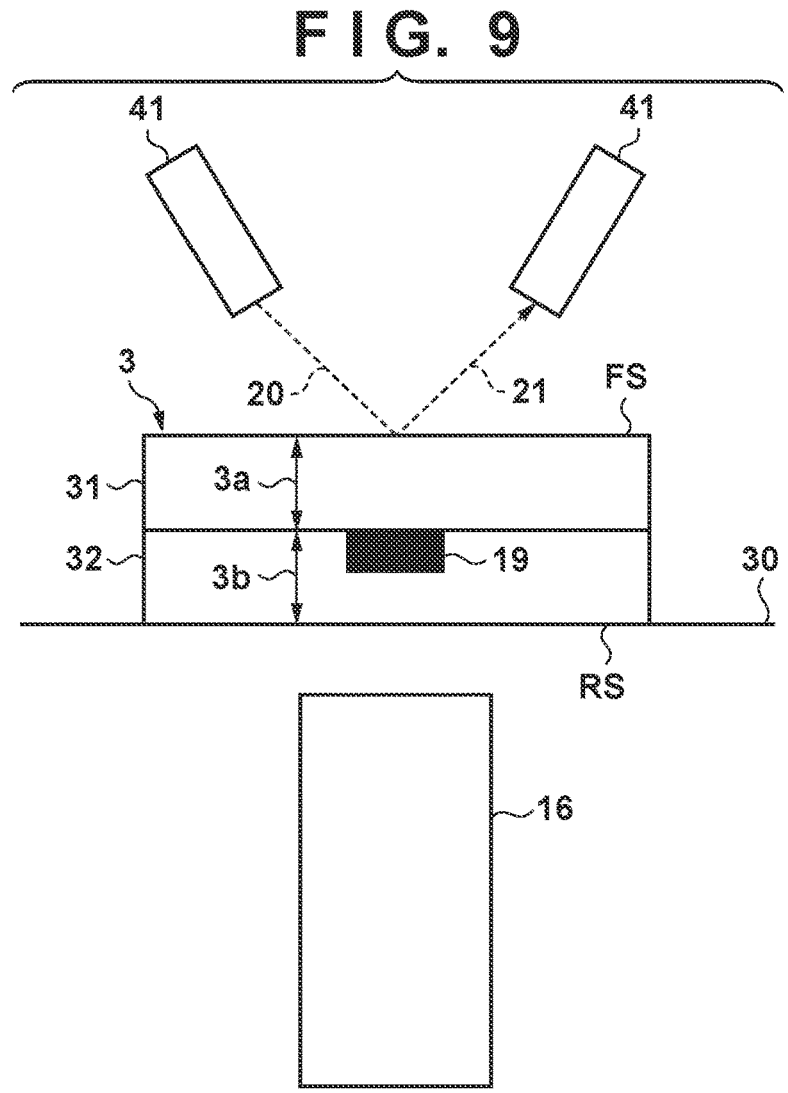
FIG. 9 is a view showing an example of another arrangement of a wafer alignment detector.

FIG. 9 shows an example of another arrangement of a wafer alignment detector 16. In the example of FIG. 6, the wafer alignment detector 16 is arranged to detect an image of a mark through an upper surface FS of a wafer. In contrast, in FIG. 9, the wafer alignment detector 16 is arranged to detect the image of the mark through a lower surface RS of the wafer. As a result, a mark 19 can be detected even in a case in which a layer through which infrared light cannot be transmitted is present between the upper surface FS and the mark 19. In this case, the wafer alignment detector 16 is arranged separately from the wafer stage, and the wafer stage can be driven to change the relative positions of the wafer and the wafer alignment detector 16. As a result, the focus position can be changed. In this arrangement, the height position of the surface of the wafer calculated by an AF detector 41 and a distance 3*b* from the lower surface of the wafer to the mark are used to calculate the offset amount for the wafer alignment detector 16 to start the image autofocus operation. This offset amount $OS_{bottom}$ is expressed as follows.

$$OS_{bottom} = \text{distance } 3b/\text{refractive index of lower layer } 32 \quad (3)$$

Figure 10:
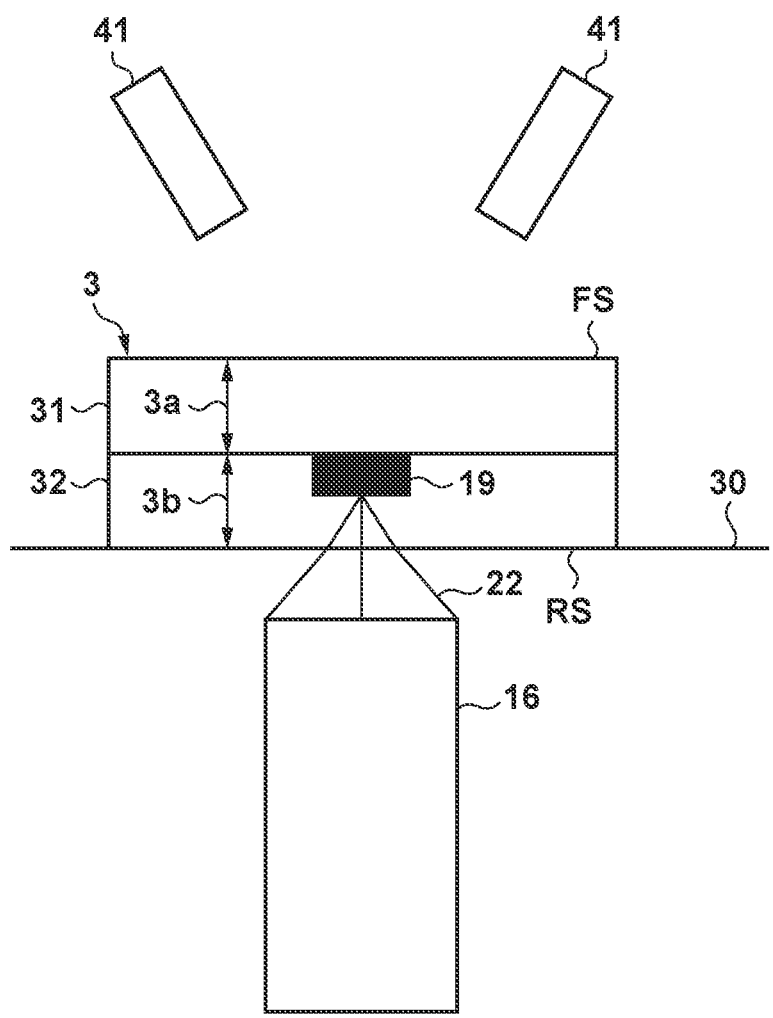
FIG. 10 is a view for explaining an offset driving operation of the wafer alignment detector in the example of FIG. 9.

As a result, as shown in FIG. 10, it is possible to determine, with respect to the mark 19 inside a wafer 3, the starting point of the image autofocus operation of the wafer alignment detector 16, which is arranged on the side of the lower surface of the wafer. Also, in a case in which the variation of distance 3*a* is less than that of the distance 3*b* in a manner similar to the first embodiment, the offset amount $OS_{bottom}$ can be calculated as follows.

$$OS_{bottom} = (\text{total thickness of wafer} - \text{distance } 3a)/\text{refractive index of lower layer } 32 \quad (4)$$

Note that an arrangement in which a value corresponding to the distance with the less variation among the plurality of wafers, which is the arrangement of the second embodiment, may be combined with and applied to the arrangement according to this embodiment.

Fourth Embodiment

Figure 11:
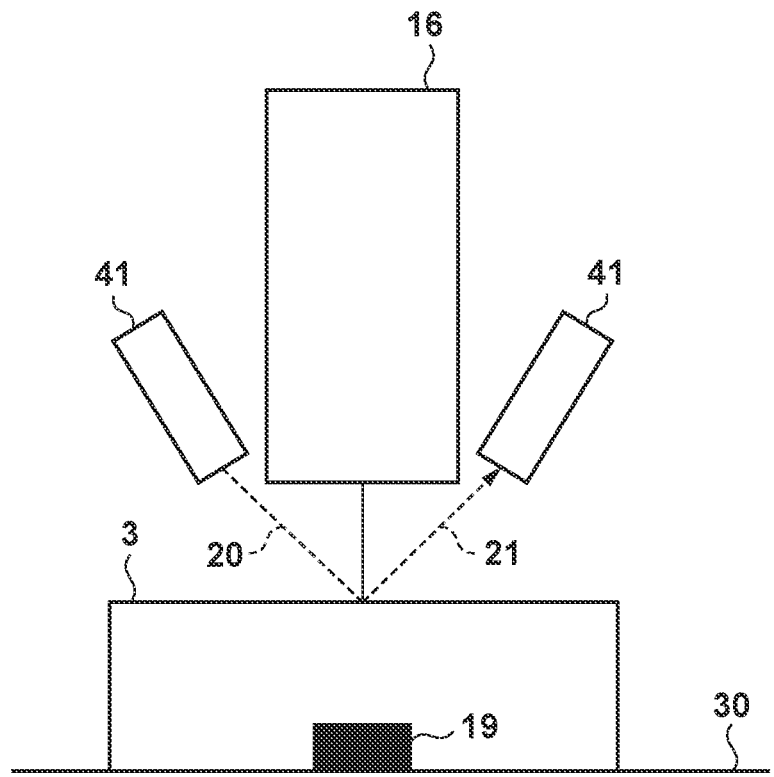
FIG. 11 is a view for explaining an operation by an AF detector performed on a substrate on which a mark has been formed on a lower surface.

In the fourth embodiment, the image autofocus measurement operation of a mark 19 on the lower surface of a wafer 3 is performed at a high speed. As shown in FIG. 11, an AF detector 41 detects the upper surface of the wafer. A processor P uses the height position of the upper surface of the wafer, which is detected by the AF detector 41, and the thickness information and the refractive index information of the wafer, which are set in advance, to calculate the offset amount for a wafer alignment detector 16 to start the image autofocus operation. An offset amount OS is calculated as follows.

$$OS = \text{thickness of wafer/refractive index of wafer} \quad (5)$$

Figure 12:
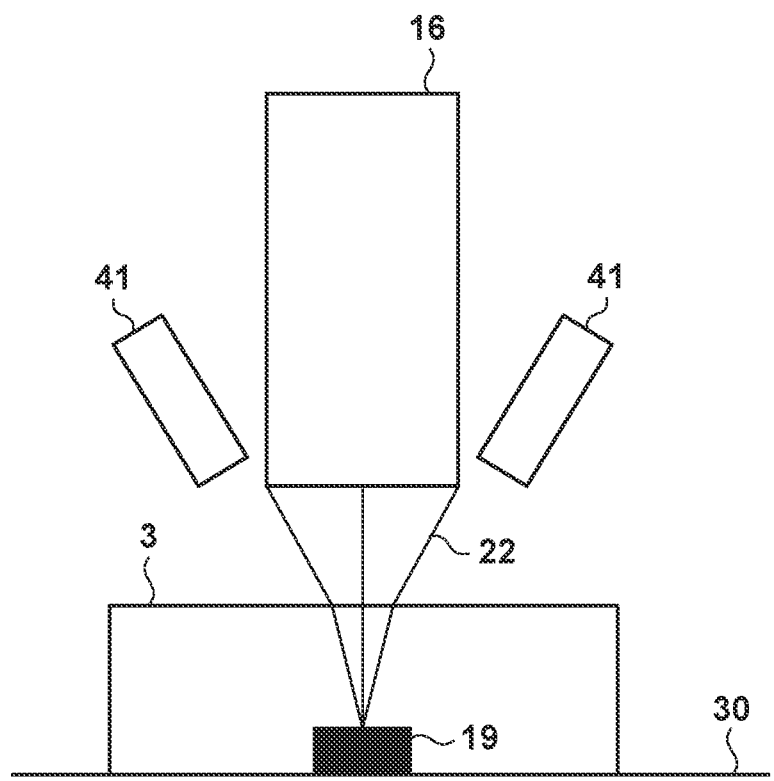
FIG. 12 is a view for explaining an offset driving operation of a wafer alignment detector in the example of FIG. 11.

Note that the "thickness of wafer" can be calculated from the difference between the height position of the upper surface of the wafer detected by the AF detector 41 and the height position of the lower surface (=a wafer support surface) of the wafer. As a result, even in a case in which there is variation in the "thickness of wafer", the influence of the variation can be ignored by calculating the thickness of the wafer and using the calculated thickness each time. In this manner, as shown in FIG. 12, it is possible to accurately determine the starting point of the image autofocus operation to be performed on the mark 19 on the lower surface of the wafer 3 by the wafer alignment detector 16. Note that a value obtained by measuring the upper surface of the wafer support surface in advance by the AF detector 41 can be stored and used as the height position of the lower surface of the wafer.

Embodiment of Article Manufacturing Method

An article manufacturing method according to an embodiment of the present invention suitably manufactures an article, for example, a microdevice such as a semiconductor device or an element having a microstructure. The article manufacturing method of this embodiment includes a step of forming a latent pattern by using the above-described patterning method or lithography apparatus on a photosensitive agent applied on a substrate (an exposure step of exposing the substrate), and a development step of developing the substrate on which the latent pattern has been formed in the above step. In addition, the manufacturing method includes other well-known steps (for example, oxidation, film formation, deposition, doping, planarization, etching, resist removal, dicing, bonding, and packaging). The article manufacturing method of this embodiment is more advantageous than the conventional methods in at least one of the performance, quality, productivity, and production cost of the article.

The present invention is not limited to the above-described embodiments, and various changes and modifications can be made within the spirit and scope of the present invention. Therefore, to apprise the public of the scope of the present invention, the following claims are made.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-024696, filed Feb. 14, 2019, which is hereby incorporated by reference herein in its entirety.

What is claimed is:

1. A measurement apparatus that measures a position of a mark formed between a first surface and a second surface on a side opposite to the first surface of a substrate, the apparatus comprising:
    a stage configured to hold and move the substrate;
    a first detector configured to detect an image of the mark;
    a second detector configured to detect a height position of the first surface; and
    a processor configured to determine, based on the height position of the first surface detected by the second detector, an offset amount used to set the focus of the first detector to the mark,
    wherein the processor includes a first mode in which the offset amount is determined based on a first distance set as a distance from the first surface to the mark, and a second mode in which the offset amount is determined based on a second distance set as a distance from the second surface to the mark.

2. The apparatus according to claim 1, wherein in the first mode, the processor determines, as the offset amount, an amount obtained by dividing the first distance by a refractive index of a layer extending from the first surface to the mark, and in the second mode, the processor determines, as the offset amount, a value obtained by dividing a value, which is obtained by subtracting the second distance from a distance between the first surface and the second surface, by the refractive index.

3. The apparatus according to claim 1, wherein the processor performs a focus control process in which a height of the stage is adjusted so as to set the focus of the first detector to the mark after moving the stage to a height position that has been offset by the offset amount, and the processor obtains the position of the mark based on the image of the mark detected by the first detector after the focus control process.

4. The apparatus according to claim 3, wherein the processor selects the first mode in a case in which a variation in measured values of the distance between the first surface and the mark is less than a variation in measured values of the distance between the second surface and the mark among a plurality of substrates, and otherwise, the processor selects the second mode.

5. The apparatus according to claim 4, wherein the processor obtains the measured value based on the height position of the first surface detected by the second detector and a result of the focus control process.

6. The apparatus according to claim 5, further comprising:
    a memory configured to store the first distance and the second distance,
    wherein each time a first measured value which is a measured value of the distance between the first surface and the mark and a second measured value which is a measured value of the distance between the second surface and the mark are obtained, the processor updates the first distance and the second distance stored in the memory by the first measured value and the second measured value, respectively.

7. The apparatus according to claim 1, wherein the first detector is arranged so as to detect the image of the mark through the first surface.

8. The apparatus according to claim 1, wherein the first detector is arranged so as to detect the image of the mark through the second surface.

9. The apparatus according to claim 1, further comprising:
an input device for a user to select the first mode or the second mode.

10. The apparatus according to claim 1, wherein the second detector obliquely projects light to the first surface and detects the light reflected by the first surface to detect the height position of the first surface.

11. The apparatus according to claim 4, wherein in the focus control process, the processor obtains a contrast curve of the image of the mark by detecting the image of the mark by the first detector while moving the stage from a starting point which is set at a height position that has been offset by the offset amount, and the processor obtains, as a best focus position, a height position at which the contrast is at a peak level in the contrast curve.

12. An exposure apparatus that exposes a substrate, comprising:
a measurement apparatus defined in claim 1; and
a controller configured to control the stage based on a position of a mark on the substrate measured by the measurement apparatus.

13. A method of manufacturing an article, comprising:
exposing a substrate by using an exposure apparatus defined in claim 12;
developing the exposed substrate; and
manufacturing the article from the developed substrate.

* * * * *